(12) United States Patent
Masatsugu et al.

(10) Patent No.: US 12,179,593 B2
(45) Date of Patent: Dec. 31, 2024

(54) ON-VEHICLE HUMAN SENSING SWITCH

(71) Applicant: TOYODA GOSEI CO., LTD., Kiyosu (JP)

(72) Inventors: Yoshinori Masatsugu, Kiyosu (JP); Yasushi Hibino, Kiyosu (JP); Mineo Fukui, Kiyosu (JP)

(73) Assignee: TOYODA GOSEI CO., LTD., Aichi-pref. (JP)

( * ) Notice: Subject to any disclaimer, the term of this patent is extended or adjusted under 35 U.S.C. 154(b) by 246 days.

(21) Appl. No.: 17/795,958

(22) PCT Filed: Dec. 8, 2020

(86) PCT No.: PCT/JP2020/045607
§ 371 (c)(1),
(2) Date: Jul. 28, 2022

(87) PCT Pub. No.: WO2021/166386
PCT Pub. Date: Aug. 26, 2021

(65) Prior Publication Data
US 2023/0114945 A1  Apr. 13, 2023

(30) Foreign Application Priority Data

Feb. 21, 2020  (JP) .................................. 2020-028578

(51) Int. Cl.
*B60K 35/00*  (2024.01)
*G06F 3/041*  (2006.01)
(Continued)

(52) U.S. Cl.
CPC .......... *B60K 35/00* (2013.01); *G06F 3/04164* (2019.05); *H03K 17/955* (2013.01);
(Continued)

(58) Field of Classification Search
CPC .............. B60K 35/00; B60K 2360/141; B60K 2360/1434; B60K 2360/1446;
(Continued)

(56) References Cited

U.S. PATENT DOCUMENTS 10,112,533 B2  10/2018  Yamamoto
10,416,820 B2   9/2019  Mugiraneza et al.
(Continued)

FOREIGN PATENT DOCUMENTS

JP  2006-321336 A  11/2006
JP  2007-164695 A   6/2007
(Continued)

OTHER PUBLICATIONS

Notification of Reasons for Refusal issued May 30, 2023 in the corresponding Japanese Application No. 2020-028578 (and English machine translation).
(Continued)

*Primary Examiner* — Mahmoud S Ismail
(74) *Attorney, Agent, or Firm* — Posz Law Group, PLC

(57) ABSTRACT

An on-vehicle human sensing switch includes: a display having a display area for luminously displaying a switch image of a vehicle-mounted electronic device; a light transmission type touch panel substrate body disposed on the display; and a light transmission type decorative body disposed on the touch panel substrate body. The touch panel substrate body includes, on a substrate, an electrostatic capacitance type sensor electrode configured to detect approach of a detection target, and an electrostatic capacitance type switch electrode which is disposed at a position opposing the display area and is configured to detect an action of the detection target. When approach of the detection target is detected by the sensor electrode, the switch image is displayed on the display.

7 Claims, 5 Drawing Sheets

(51) Int. Cl.
  *H03K 17/955* (2006.01)
  *H03K 17/96* (2006.01)
  *B60K 35/10* (2024.01)

(52) U.S. Cl.
  CPC ............ *H03K 17/962* (2013.01); *B60K 35/10* (2024.01); *B60K 2360/141* (2024.01); *B60K 2360/1434* (2024.01); *B60K 2360/1446* (2024.01); *G06F 2203/04108* (2013.01)

(58) Field of Classification Search
  CPC .... B60K 35/10; H03K 17/955; H03K 17/962; G06F 3/04164; G06F 2203/04108
  USPC .......................................................... 701/36
  See application file for complete search history.

(56) References Cited

U.S. PATENT DOCUMENTS

| 10,919,447 | B2 | 2/2021 | Yamamoto |
| 2014/0355285 | A1 | 12/2014 | Yamamoto |
| 2017/0308200 | A1* | 10/2017 | Mugiraneza ......... H03K 17/962 |
| 2018/0046369 | A1 | 2/2018 | Takano et al. |
| 2019/0018528 | A1* | 1/2019 | Higano ................. G02F 1/1345 |
| 2019/0071009 | A1 | 3/2019 | Yamamoto |
| 2019/0080864 | A1* | 3/2019 | Sawada .................. H01H 15/06 |

FOREIGN PATENT DOCUMENTS

| JP | 2010-244812 | A | 10/2010 |
| JP | 6223185 | B | 8/2013 |
| JP | 2018-025916 | A | 2/2018 |
| JP | 2018-092497 | A | 6/2018 |
| WO | 2016/056516 | A1 | 4/2016 |

OTHER PUBLICATIONS

International Search Report dated Mar. 2, 2021, issued in corresponding International Patent Application No. PCT/JP2020/045607.
Notification of Reasons for Refusal issued Jan. 31, 2023 in the corresponding Japanese Application No. 2020-028578 (and English machine translation).

* cited by examiner

ON-VEHICLE HUMAN SENSING SWITCH

CROSS REFERENCE TO RELATED APPLICATION

This application is a U.S. national stage application of PCT/JP2020/045607 filed on Dec. 8, 2020, which claims priority to Japanese application no. 2020-028578 filed on Feb. 21, 2020, the contents of which are incorporated herein by reference.

Technical Field

The present invention relates to an on-vehicle human sensing switch.

BACKGROUND ART

Various vehicle-mounted articles are installed in a vehicle. The vehicle-mounted articles include various types of vehicle-mounted electronic devices such as an air conditioner, a car navigation system, and a car audio. Switches for operating these vehicle-mounted electronic devices are generally integrated with other vehicle-mounted articles. Examples of the other vehicle-mounted articles include various types of interior/exterior panels represented by an instrument panel, a console box, a steering wheel, and the like.

In recent years, it has been proposed that a series of vehicle-mounted articles, which are adjacent to each other or functionally related to each other, are made to have a uniform appearance so that a user recognizes these articles as if they are continuous.

Making the series of vehicle-mounted articles to have a uniform appearance, i.e., a seamless appearance, enhances visual unity of the vehicle-mounted articles, and enhances the pleasing appearance of the vehicle-mounted articles. Moreover, when the series of vehicle-mounted articles, which have the seamless appearance, are installed in a vehicle, the pleasing appearance and comfortability of the vehicle are also enhanced.

In recent years, touch panel type information terminal devices represented by smartphones have become popular, and touch panel type switches have also become popular. According to a touch panel type switch, an image (switch image) for operating a vehicle-mounted electronic device is displayed on a display. When the user has performed a predetermined action to the switch image, the switch detects the action, and controls operation of the vehicle-mounted electronic device on the basis of the action (see Patent Literature 1, for example).

CITATION LIST

Patent Literature

Patent Literature 1: JP2018-92497 (A)

SUMMARY OF INVENTION

Technical Problem

Meanwhile, in the above-described touch panel type switch, since power is consumed when the display displays the switch image, constantly displaying the switch image is uneconomical. In particular, when the touch panel type switch is installed in a vehicle, unnecessary power consumption needs to be avoided. The inventors of the present invention have conceived of displaying the switch image only when the user operates and uses the touch panel type switch. In addition, the inventors have conceived of making the touch panel type switch seamless with respect to a vehicle-mounted article related to the switch.

The present invention has been made in view of the above circumstances, and an object of the present invention is to provide a novel touch panel type switch which, when being used, displays a switch image that was in a non-displayed state, and whose appearance is made to be uniform with the appearance of a vehicle-mounted article adjacent to the switch.

Solution to Problem

An on-vehicle human sensing switch, of the present invention, solving the problems described above includes: a display having a display area for luminously displaying a switch image of a vehicle-mounted electronic device; a light transmission type touch panel substrate body disposed on the display; and a light transmission type decorative body disposed on the touch panel substrate body, the touch panel substrate body includes, on a substrate, an electrostatic capacitance type sensor electrode configured to detect approach of a detection target, and an electrostatic capacitance type switch electrode which is disposed at a position opposing the display area and is configured to detect an action of the detection target, and when approach of the detection target is detected by the sensor electrode, the switch image is displayed on the display.

The on-vehicle human sensing switch of the present invention is a novel touch panel type switch which, when being used, displays a switch image that was in a non-displayed state, and whose appearance is made to be uniform with the appearance of a vehicle-mounted article adjacent to the switch.

DESCRIPTION OF EMBODIMENTS

Figure 1:
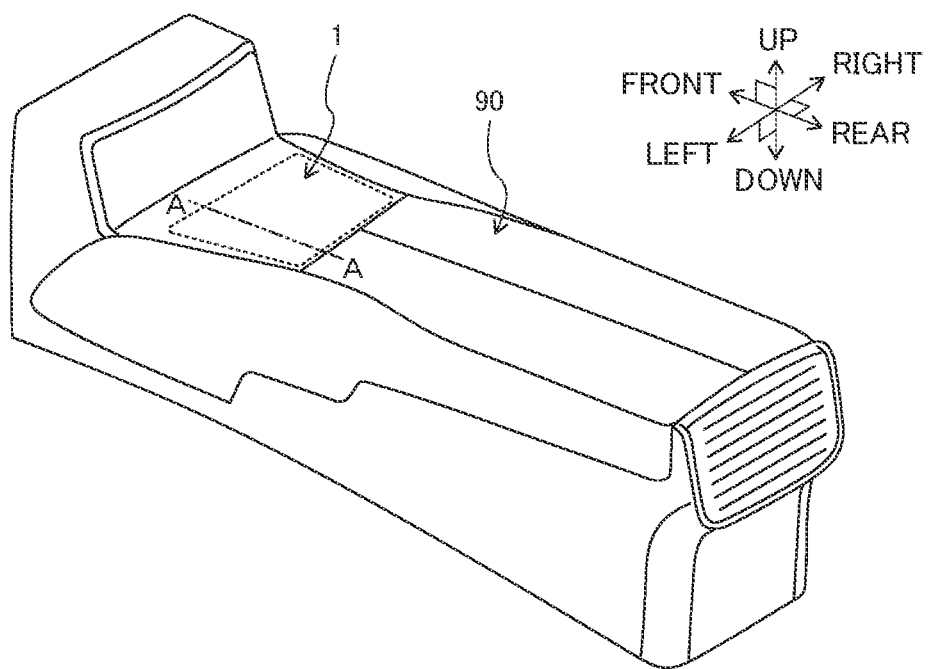
FIG. 1 schematically illustrates a center console box and an on-vehicle human sensing switch according to Embodiment 1.

The on-vehicle human sensing switch according to the present invention is specifically described below.

Unless otherwise specified, a numerical value range "x to y" described herein includes, in the range thereof, a lower limit x and an upper limit y. A numerical value range may be formed by optionally combining the upper limit values and the lower limit values, and numerical values described in the embodiments. Numerical values optionally selected from the numerical value range may be used as the upper and lower limit values.

An on-vehicle human sensing switch of the present invention includes: a display having a display area for luminously displaying a switch image of a vehicle-mounted electronic device; a light-transmitting touch panel substrate body disposed on the display; and a light-transmitting decorative body disposed on the touch panel substrate body, the touch panel substrate body includes, on a substrate, an electrostatic capacitance type sensor electrode configured to detect approach of a detection target, and an electrostatic capacitance type switch electrode which is disposed at a position opposing the display area and is configured to detect an action of the detection target, and when approach of the detection target is detected by the sensor electrode, the switch image is displayed on the display.

The on-vehicle human sensing switch of the present invention includes the display, the touch panel substrate body disposed on the display, and the decorative body disposed on the touch panel substrate body. The display luminously displays a switch image, and the touch panel substrate body and the decorative body are of a light transmission type. Therefore, the switch image luminously displayed by the display is transmitted through the touch panel substrate body and the decorative body, and is visually recognized by the user.

When the user performs a predetermined action to the switch image, the electrostatic capacitance type switch electrode detects a change in electrostatic capacitance based on this motion. The detection result of the switch electrode is directly or indirectly transmitted to the vehicle-mounted electronic device, whereby the vehicle-mounted electronic device is operated as the user intends.

Thus, the on-vehicle human sensing switch of the present invention functions as the touch panel type switch described above.

The on-vehicle human sensing switch of the present invention includes the sensor electrode in addition to the switch electrode and the display. The sensor electrode is of an electrostatic capacitance type like the switch electrode, and detects, by a change in electrostatic capacitance, approach of the detection target, i.e., the user, to the sensor electrode. Upon receiving the detection result from the sensor electrode, the on-vehicle human sensing switch of the present invention displays the switch image on the display.

Therefore, according to the on-vehicle human sensing switch of the present invention, the switch image is not displayed on the display when the sensor electrode does not detect approach of the detection target.

Thus, according to the on-vehicle human sensing switch of the present invention, unnecessary power consumption is avoided by displaying the switch image on the display only when the switch is used.

While the switch image is not displayed, the display may be put in a sleep state or the display may be powered off. An image other than the switch image may be displayed on the display if needed.

The on-vehicle human sensing switch of the present invention includes the light transmission type touch panel substrate body in which the switch electrode and the sensor electrode are formed on the same substrate.

The switch electrode and the sensor electrode being of the same electrostatic capacitance type allow these electrodes to be suitably disposed on the same substrate. Thus, the touch panel substrate body is made compact, and consequently, the on-vehicle human sensing switch of the present invention is made compact.

The switch electrode and the sensor electrode being disposed on the same substrate allow the switch lead part extending from the switch electrode and the sensor lead part extending from the sensor electrode to be disposed in the same terminal portion, and allow the switch lead part and the sensor lead part to have minimum required lengths. This is advantageous for further compactification of the touch panel substrate body, and reduction in response times of the switch electrode and the sensor electrode.

In the on-vehicle human sensing switch of the present invention, the light transmission type decorative body is disposed above the display and the touch panel substrate body. Therefore, in the on-vehicle human sensing switch of the present invention, when the display is powered off or put in the sleep state to halt luminous display of the display, then if transmission of light from the lower-layer side is ceased or reduced, a design derived from the decorative body becomes clear at the surface of the decorative body, i.e., at the uppermost layer.

If the design derived from the decorative body is made to be uniform with the design of the vehicle-mounted article related to the on-vehicle human sensing switch of the present invention, the appearance of the on-vehicle human sensing switch of the present invention is made uniform with the appearance of the vehicle-mounted article adjacent to the switch when the switch is not used.

Hereinafter, the on-vehicle human sensing switch of the present invention is described for each component.

The display in the on-vehicle human sensing switch of the present invention luminously displays a switch image.

For such a display, a known display element, such as a liquid crystal element, an organic IL element, an LED element, or a micro LED element, may be selected and used as appropriate. Although the display luminously displays the switch image, a display element that does not spontaneously emit light, such as a liquid crystal element, may be selected as the display element for the display. In this case, a light-emitting element such as a backlight disposed beneath the display allows the display to luminously display the switch image. The "switch image" is described later in detail.

The switch electrode is an electrostatic capacitance type electrode for operating a vehicle-mounted electronic device. A vehicle-mounted electronic device to be subjected to an operation using the switch electrode is an electronic device to be mounted in a vehicle. Examples of the vehicle-mounted electronic device include a seat heater, a seat driving device for adjusting the height and angle of a seat, an image reproduction device for reproducing various images and videos, a lighting device, and a communication device, in addition to an air conditioner, a car navigation system, and a car audio described above. The switch electrode is used for operating one type of vehicle-mounted electronic device, but is preferably capable of operating a plurality of vehicle-mounted electronic devices when convenience of the user is considered. If a plurality of switch images are displayed stepwise and/or hierarchically as described later, it is possible to operate a plurality of vehicle-mounted electronic devices by using one switch electrode. Alternatively, the plurality of switch images may be simultaneously displayed.

As described above, the switch electrode detects a change in electrostatic capacitance caused by an action of the user to the switch image displayed on the display, and has a function as a sensor for detecting an action of the user.

For convenience in detecting an action of the user, the switch electrode preferably has a size corresponding to the entire action range of the user and is provided over the entire action range of the user.

Here, the action range of the user means a range, above the touch panel substrate body, in which the user performs a predetermined action to the switch image. Specifically, the switch electrode is preferably disposed so as to cover the entirety of the switch image display area on the display, i.e., the entirety of the display area.

In the present invention, the "switch image" means an image for performing an operation on a vehicle-mounted electronic device, for example, on/off of the vehicle-mounted electronic device, change in the operation state of the vehicle-mounted electronic device, or the like. Specifically, for example, if the vehicle-mounted electronic device is an air conditioner, the switch image is preferably an image that urges the user to perform a predetermined action regarding on/off switching of the air conditioner, mode selection between heating, cooling, fan only, etc., or change of settings such as air volume, temperature, etc. These switch images may be simultaneously displayed, or may be stepwise or hierarchically displayed.

The switch image may be composed of only characters, may be composed of only graphics whose meanings are recognizable by the user, or may be composed of characters and graphics. The switch image may not necessarily be a still image, and may be a moving image such as animation.

When the various types of switch images are stepwise or hierarchically displayed, a range to be detected by the switch electrode and a display timing vary depending the corresponding switch image. In this case, an amount of change in electrostatic capacitance detected by the switch electrode is preferably corrected as appropriate according to the type of the switch image displayed on the display.

The on-vehicle human sensing switch of the present invention may have an electronic device control element for controlling operation of a vehicle-mounted electronic device on the basis of the detection result of the switch electrode. The electronic device control element may have, for example, functions of: transmitting the detection result of the switch electrode to the vehicle-mounted electronic device; transmitting a control signal based on the detection result to the vehicle-mounted electronic device; and correcting as appropriate an amount of change in electrostatic capacitance detected by the switch electrode.

The electronic device control element may be connected to the switch electrode and the vehicle-mounted electronic device wirelessly or via wires and directly or indirectly.

Since the touch panel substrate body on which both the switch electrode and the sensor electrode are formed is of a light transmission type, the electronic device control element is preferably formed on a substrate different from the substrate of the switch electrode and the sensor electrode. That is, since the electronic device control element need not be disposed on the upper side of the display, a substrate body and various components forming the electronic device control element need not be of the light transmission type. Therefore, the electronic device control element is preferably disposed at a position other than the upper side of the display, such as the lower side or the lateral side of the display.

In this specification, the "light transmission type" is a concept including not only "perfectly transparent" but also "semi-transparent". Specifically, in this specification, if a certain member transmits 5% or more of visible light having a wavelength of 380-780 nm, this member is regarded as a light transmission type member.

The sensor electrode detects approach of the detection target, i.e., the user, on the basis of a change in electrostatic capacitance. As described above, the sensor electrode is formed on the same substrate as the substrate of the switch electrode.

Unlike the switch electrode, the sensor electrode need not be disposed at a position opposing a display area of the display. Therefore, the sensor electrode is formed on the same substrate as the substrate of the switch electrode without invading the area where the switch electrode is disposed.

In the on-vehicle human sensing switch of the present invention, when the sensor electrode has detected a change in electrostatic capacitance, the display is caused to display the switch image. Therefore, the on-vehicle human sensing switch of the present invention may have a display control element for causing the display to display the switch image on the basis of the detection result of the sensor electrode. For example, the display control element may transmit a control signal based on the detection result of the sensor electrode to the display.

The display control element and the electronic device control element may be provided separately from each other or integrally with each other. The display control element also need not be disposed on the upper side of the display, and therefore is suitably disposed on the lower side or the lateral side of the display, like the electronic device control element.

The substrate on which the switch electrode and the sensor electrode are formed may be made of any material as long as it is a light transmission type substrate. Preferably, a plastic film such as polyimide is used.

Since the sensor electrode detects approach of the user to the on-vehicle human sensing switch of the present invention, when the sensor electrode has detected a change in electrostatic capacitance, the user desires to operate the on-vehicle human sensing switch of the present invention. More specifically, at this time, the user is approaching the switch image displayed on the display and the switch electrode disposed above the switch image.

Therefore, in order to accurately detect approach of the detection target, i.e., the user, to the switch electrode by the sensor electrode, the sensor electrode is preferably disposed near the switch electrode.

Here, "near" specifically means that the distance between the sensor electrode and the switch electrode is not larger than 20 mm. Examples of preferable distances between the sensor electrode and the switch electrode include not larger than 15 mm, not larger than 10 mm, not larger than 8 mm, and not larger than 5 mm.

In order to accurately detect approach of the user to the switch electrode by the sensor electrode, the sensor electrode is preferably disposed so as to surround the switch electrode. Thus, approach of the user to the switch electrode is detected from multiple directions.

In the case of surrounding the switch electrode with the sensor electrode, a plurality of sensor electrodes may be used, but it is preferable that one sensor electrode continuously surrounds the switch electrode. Thus, lead wires required for the sensor electrode are minimized, which leads to compactification of the touch panel substrate, and to reduction in the response time of the sensor electrode.

A lead wire is connected to each of the switch electrode and the sensor electrode. In this specification, a lead wire extending from the switch electrode is referred to as a switch lead part and a lead wire extending from the sensor electrode is referred to as a sensor lead part, according to need.

The positions of the switch lead part and the sensor lead part with respect to the switch electrode and the sensor electrode are not particularly limited. However, there are optimum positions for the switch lead part and the sensor lead part, when compactification of the on-vehicle human sensing switch of the present invention, responsibilities of the switch electrode and the sensor electrode, and the like are considered.

Specifically, the switch lead part and the sensor lead part may be individually connected to the display, the vehicle-mounted electronic device, the electronic device control element, or the like. However, when compactification of the on-vehicle human sensing switch of the present invention is considered, these lead parts preferably form a single terminal portion. In this case, the terminal portion is preferably disposed on a side opposite to the sensor electrode across the switch electrode. Thus, an adverse effect of noise derived from the terminal portion on the sensor electrode, is reduced.

Depending on a relationship between a placement position, in the vehicle, of the on-vehicle human sensing switch of the present invention, and a movement line of the user, it is difficult for the sensor electrode to perform accurate detection in some cases.

For example, depending on a positional relationship with another vehicle-mounted electronic device, another vehicle-mounted article, or the like, the position where the on-vehicle human sensing switch of the present invention is disposed may be distant from the seat of the user or may be very close to the seat of the user. In this case, it is assumed that the sensor electrode is difficult to be disposed at an easy-to-reach position for the user although the switch image displayed on the display and the switch electrode disposed above the switch image are disposed at an easy-to-reach position for the user. Since the sensor electrode detects approach of the user by a change in electrostatic capacitance, if the sensor electrode is distant from an exposed portion of the user's body (e.g., a hand of the user), it is difficult to detect approach of the user.

In this case, the sensor electrode is turned in a direction different from the direction of the switch electrode, whereby the sensor electrode is disposed at a position sufficiently close to the hand of the user to detect the hand, while the switch electrode is disposed at an easy-to-reach position for the user.

For example, in order to accurately detect a predetermined action of fingers of the user to the switch image by using the switch electrode, the upper surface of the switch electrode is preferably turned to the palm or pads of fingers of the user. However, unlike the switch electrode, the sensor electrode need not detect the predetermined action of the user, and only needs to detect approach of the user. Therefore, the upper surface of the sensor electrode need not be turned to the palm or pads of fingers of the user, which results in a high degree of freedom in arrangement.

More specifically, preferably, the touch panel substrate body is divided into a main area and a sub-area, the upper surface of the main area and the upper surface of the sub-area are turned in directions intersecting with each other, and the switch electrode is disposed in the main area while the sensor electrode is disposed in the sub-area. Thus, the sensor electrode is disposed in a position and direction sufficiently close to the hand of the user to detect the hand, while the switch electrode is disposed at an easy-to-reach position and direction for the user.

The entirety of the sensor electrode or only a part of the sensor electrode may be disposed in the sub-area. When only a part of the sensor electrode is disposed in the sub-area, the remaining part of the sensor electrode is disposed in the main area. In this case, approach of the user is detected by the sensor electrode in various positions and directions, thereby further enhancing detection accuracy of the sensor electrode.

The intersection angle between the main area and the sub-area may be set as appropriate according to the position, size, or the like of the on-vehicle human sensing switch of the present invention. However, in order to further enhance the effect of increasing the detection accuracy by the sensor electrode, the intersection angle is preferably within any of the following ranges. Specifically, examples of preferable ranges of the intersection angle (inferior angle) between the main area and the sub-area include: not smaller than 20° and not larger than 175°; not smaller than 20° and not larger than 165°; not smaller than 20° and not larger than 160°; not smaller than 90° and not larger than 160°; and not smaller than 120° and not larger than 160°.

Hereinafter, the on-vehicle human sensing switch according to the present invention is described with specific examples.

Embodiment 1

Figure 2:
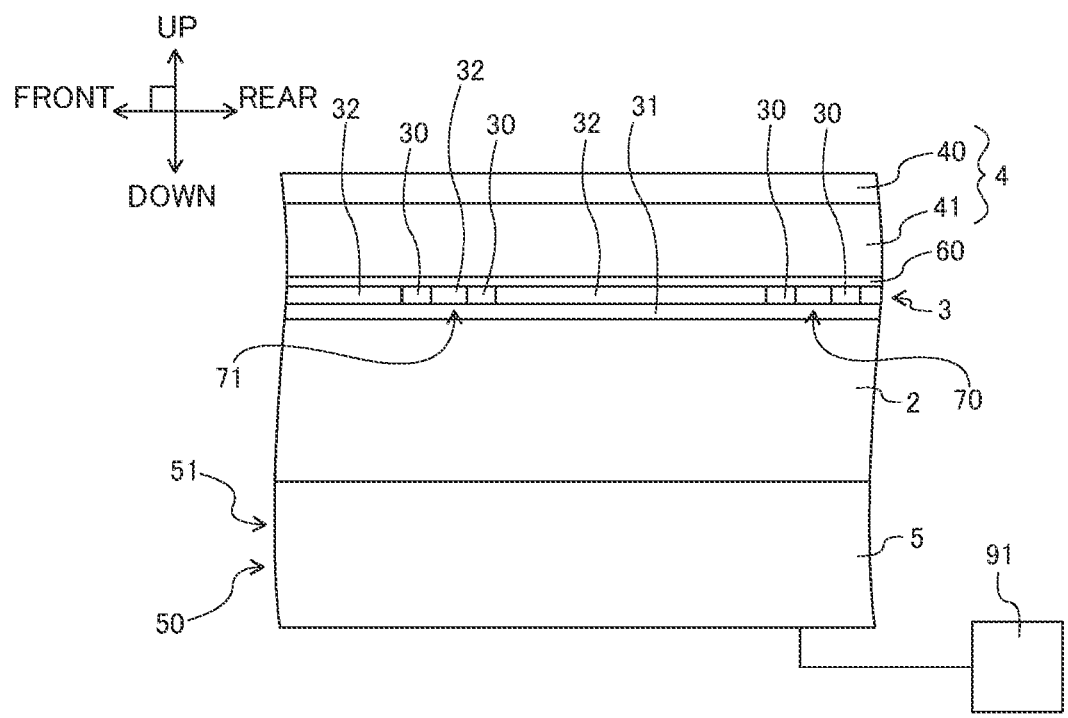
FIG. 2 schematically illustrates a cross-sectional view of the on-vehicle human sensing switch according to Embodiment 1 taken at an A-A position in FIG. 1.
Figure 3:
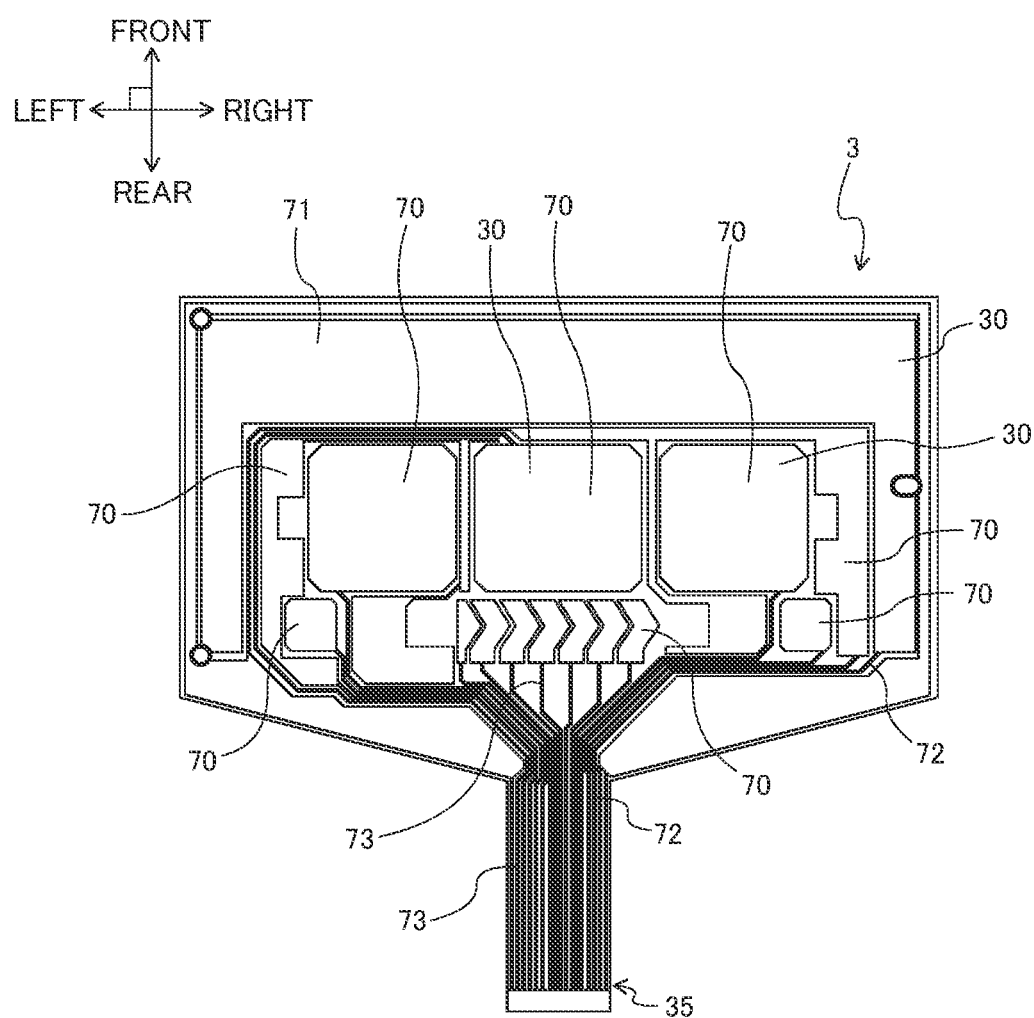
FIG. 3 schematically illustrates a touch panel substrate body in the on-vehicle human sensing switch according to Embodiment 1.
Figure 4:
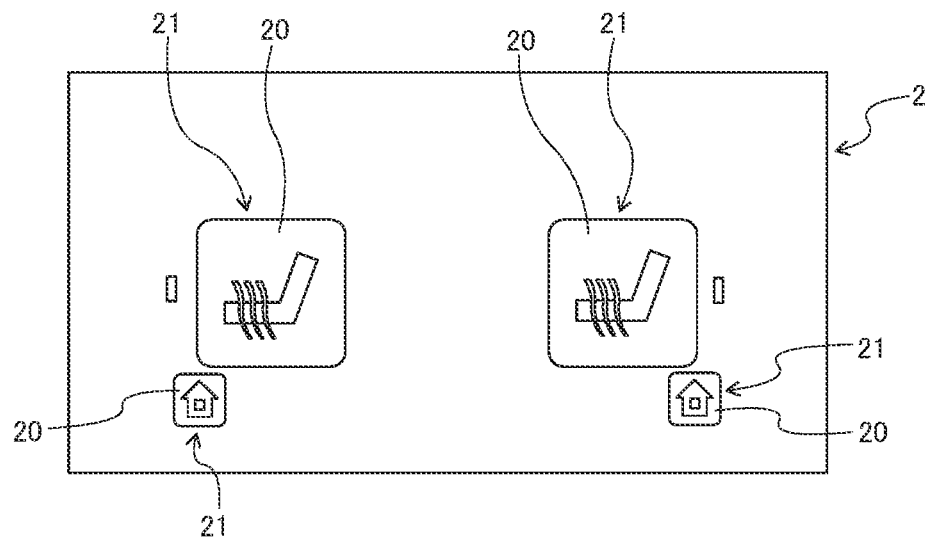
FIG. 4 schematically illustrates a switch image displayed on a display in the on-vehicle human sensing switch according to Embodiment 1.
Figure 5:
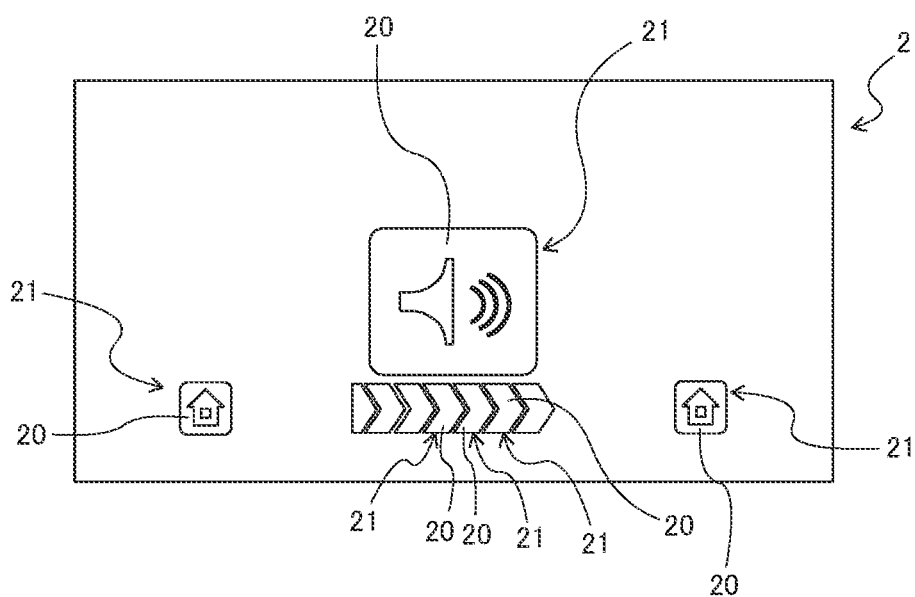
FIG. 5 schematically illustrates a switch image displayed on the display in the on-vehicle human sensing switch according to Embodiment 1.

An on-vehicle human sensing switch according to Embodiment 1 is integrated with a center console box which is a kind of a vehicle-mounted article. FIG. 1 schematically illustrates the center console box and the on-vehicle human sensing switch according to Embodiment 1. FIG. 2 schematically illustrates a cross-sectional view of the on-vehicle human sensing switch according to Embodiment 1, taken along an A-A position in FIG. 1. FIG. 3 schematically illustrates a touch panel substrate body in the on-vehicle human sensing switch according to Embodiment 1. FIG. 4 and FIG. 5 schematically illustrate switch images displayed on a display in the on-vehicle human sensing switch according to Embodiment 1.

Hereinafter, in Embodiment 1, up, down, left, right, front, and rear refer to up, down, left, right, front, and rear shown in the drawings. The up-down direction corresponds to the vertical direction, the front-rear direction corresponds to the vehicle advancing direction, and the left-right direction corresponds to the vehicle width direction.

As shown in FIG. 1, an on-vehicle human sensing switch 1 according to Embodiment 1 is integrated with an upper surface of a center console box 90 which is a vehicle-mounted article.

As shown in FIG. 2, the on-vehicle human sensing switch 1 according to Embodiment 1 includes a display 2, a touch panel substrate body 3 disposed on the display 2, a decorative body 4 disposed on the touch panel substrate body 3, and a main substrate body 5 disposed beneath the display 2.

The decorative body 4 includes: a decorative layer 40 which is an uppermost layer in the on-vehicle human sensing switch 1 according to Embodiment 1, and is exposed at an upper surface of the center console box 90; and a reinforcement layer 41 disposed beneath the decorative layer 40.

The decorative layer 40 has a woodgrain pattern which is the same as a pattern on the upper surface of the center console box 90. Therefore, the decorative layer 40 and the upper surface of the center console box 90 have a uniform appearance, which allows the center console box 90 and the on-vehicle human sensing switch 1 of the present invention to be visually monolithic.

The decorative layer 40 is obtained by printing a pattern of a light-transmitting paint to a film made of an acryl resin which is a kind of a light-transmitting resin. The reinforcement layer 41 is also formed of an acryl resin film. The reinforcement layer 41 has a thickness of about 0.2 mm while the decorative layer 40 has a thickness of about 0.01 mm. Thus, the reinforcement layer 41 is significantly thicker than the decorative layer 40, and therefore, contributes to ensure strength of the decorative body 4.

Since the decorative layer 40 and the reinforcement layer 41 are formed of the light-transmitting material, the decorative body 4 in the on-vehicle human sensing switch 1 according to Embodiment 1 is of a light transmission type.

The touch panel substrate body 3 shown in FIG. 3 is disposed beneath the decorative body 4. The touch panel substrate body 3 is adhered to the decorative body 4 through a light transmission type adhesive layer 60.

The touch panel substrate body 3 is obtained by forming a conductive pattern 30 made of a metal on a film substrate 31 made of a plastic film. As shown in FIG. 2 and FIG. 3, the conductive pattern 30 forms switch electrodes 70, a sensor electrode 71, switch lead parts 72, and a sensor lead part 73. As shown in FIG. 2, gaps in the conductive pattern 30 are filled with an insulator 32 made of polyethylene. The touch panel substrate body 3 is also of a light transmission type.

More specifically, as shown in FIG. 3, the on-vehicle human sensing switch 1 according to Embodiment 1 includes a plurality of switch electrodes 70. Meanwhile, as shown in FIG. 4 and FIG. 5, the display 2 is provided with display areas 21 for displaying a plurality of switch images 20, respectively. Each of the switch electrodes 70 shown in FIG. 3 is disposed at a position opposing the corresponding one of the display areas 21 shown in FIG. 4 and FIG. 5. As shown in FIG. 3, the switch electrodes 70 are gathered in a center and rear area in the touch panel substrate body 3.

As shown in FIG. 3, the sensor electrode 71 has a substantially inverted U shape, and continuously surrounds the switch electrodes 70 from three directions, i.e., from the front side and the left and right sides. Each of the switch electrodes 70 and the sensor electrode 71 is of a so-called projective (or transmissive) electrostatic capacitance type, and has a plurality of sensor wires (not shown) which are formed in multiple layers on the film substrate 31 and arranged in a matrix at predetermined intervals on the upper surface of the film substrate 31. The sensor wires (not shown) allow the switch electrodes 70 and the sensor electrode 71 to detect a change in electrostatic capacitance on the touch panel substrate body 3 and coordinates at which the change in electrostatic capacitance occurs on the touch panel substrate body 3.

The switch lead part 72 extends from each switch electrode 70, and the sensor lead part 73 extends from the sensor electrode 71. End portions of the switch lead parts 72 and an end portion of the sensor lead part 73 are gathered to form a terminal portion 35.

As shown in FIG. 2, the display 2 is disposed beneath the touch panel substrate body 3. The display 2 in the on-vehicle human sensing switch 1 according to Embodiment 1 is a liquid crystal display, and has a liquid crystal panel and a backlight which are not shown. The liquid crystal panel is disposed on the upper side and the backlight is disposed on the lower side.

As shown in FIG. 2, the main substrate body 5 is disposed beneath the display 2. The main substrate body 5 functions as a display control element 50 for controlling operation of the display 2, and as an electronic device control element 51 for controlling operation of a vehicle-mounted electronic device 91.

Although not shown in FIG. 2, a terminal of the display 2 and the terminal portion 35 of the touch panel substrate body 3 are connected to the main substrate body 5.

The on-vehicle human sensing switch 1 according to Embodiment 1 is operated as follows.

First, when the switch is not used, the display 2 is in a sleep state. At this time, since the display 2 is dark and is not emitting light, substantially no light is transmitted from the lower-layer side to the touch panel substrate body 3 and the decorative body 4. Therefore, at this time, a design derived from the pattern on the decorative body 4 is clearly displayed at the surface of the on-vehicle human sensing switch 1 according to Embodiment 1. Therefore, at this time, the appearance of the on-vehicle human sensing switch 1 according to Embodiment 1 is made uniform with the appearance of the center console box 90 adjacent to the on-vehicle human sensing switch 1, thereby providing a seamless appearance.

When the user reaches for the on-vehicle human sensing switch 1 according to Embodiment 1 to operate the vehicle-mounted electronic device 91, the sensor electrode 71 detects approach of the user. Specifically, when fingers of the user who reaches for the on-vehicle human sensing switch 1 are sufficiently close to the sensor electrode 71, the sensor electrode 71 detects a change in electrostatic capacitance and transmits a detection signal to the display control element 50 in the main substrate body 5. The display control element 50 transmits, to the display 2, a control signal based on the detection signal from the sensor electrode 71, whereby a switch image 20 for operating the vehicle-mounted electronic device 91 is displayed on a display area 21 of the display 2.

When the user touches or approaches the switch image 20 to operate the vehicle-mounted electronic device 91, the switch electrode 70 located above the switch image 20 detects a change in electrostatic capacitance. Then, the switch electrode 70 transmits a detection signal according to the position, the direction, or the like of an action of the user, to the electronic device control element 51 and the display control element 50 in the main substrate body 5. In accordance with the detection signal from the switch electrode 70, the electronic device control element 51 transmits a control signal based on the detection signal to the corresponding vehicle-mounted electronic device 91. Thus, the vehicle-mounted electronic device 91 is operated to perform, for example, on/off control or temperature change for a seat heater, on/off control or volume change for a car audio, or the like. At this time, the display control element 50 may display a new image according to the above operation on the display 2.

Depending on the detection signal from the switch electrode 70, the display control element 50 of the main substrate body 5 may transmit a control signal to the display 2 and cause the display 2 to display a new switch image 20, which is different from the switch image having been displayed so far, on the display area 21. For example, a case where switch images 20 are displayed hierarchically or stepwise corresponds to the above case. This control may be repeated a plural number of times if needed.

Also, in this case, when the user touches or approaches the new switch image 20, a new detection signal is transmitted to the electronic device control element 51 and the display control element 50 from the switch electrode 70 having detected a change in electrostatic capacitance. Then, if needed, the electronic device control element 51 transmits a control signal according to the detection signal to the corresponding vehicle-mounted electronic device 91. Thus, the vehicle-mounted electronic device 91 is operated.

In a case where the operation of the vehicle-mounted electronic device 91 has ended or operation of the vehicle-mounted electronic device 91 is not necessary, when the user moves away from the on-vehicle human sensing switch 1 according to Embodiment 1, the sensor electrode 71 does not detect a change in electrostatic capacitance any longer. When this state has continued over a predetermined time, the display control element 50 of the main substrate body 5 transmits a control signal to the display 2 to restore the display 2 into the sleep state. Thus, in the on-vehicle human sensing switch 1 according to Embodiment 1, the switch image 20 is displayed on the display 2 when the sensor electrode 71 has detected approach of the detection target, i.e., the user, whereas the switch image 20 is not displayed on the display 2 when the sensor electrode 71 does not detect approach of the detection target. Thus, when the on-vehicle human sensing switch 1 according to Embodiment 1 is not used, the appearance of the on-vehicle human sensing switch 1 and the appearance of the center console box 90 are made to look seamless while avoiding unnecessary power consumption.

In the on-vehicle human sensing switch 1 according to Embodiment 1, the switch electrodes 70 and the sensor electrode 71 are of the same electrostatic capacitance type, and the switch electrodes 70 and the sensor electrode 71 are disposed on the same film substrate 31 to form the touch panel substrate body 3. Thus, the touch panel substrate body 3 is made compact. In addition, since the switch lead parts extending from the switch electrodes 70 and the sensor lead part 73 extending from the sensor electrode 71 are disposed in the same terminal portion 35, the touch panel substrate body 3 is made more compact, and moreover, response times of the switch electrodes 70 and the sensor electrode 71 are reduced.

Since the terminal portion 35 of the touch panel substrate body 3 is disposed on the side opposite to the sensor electrode 71 across the switch electrodes 70, an adverse effect of noise derived from the terminal portion 35 on the sensor electrode 71 is reduced, and consequently, detection sensitivity of the sensor electrode 71 is enhanced.

In the on-vehicle human sensing switch 1 according to Embodiment 1, the sensor electrode 71 continuously surrounds the switch electrodes 70. Therefore, approach of the user to the switch image 20 and the switch electrode 70 located above the switch image 20 is accurately detected from multiple directions.

Embodiment 2

Figure 6:
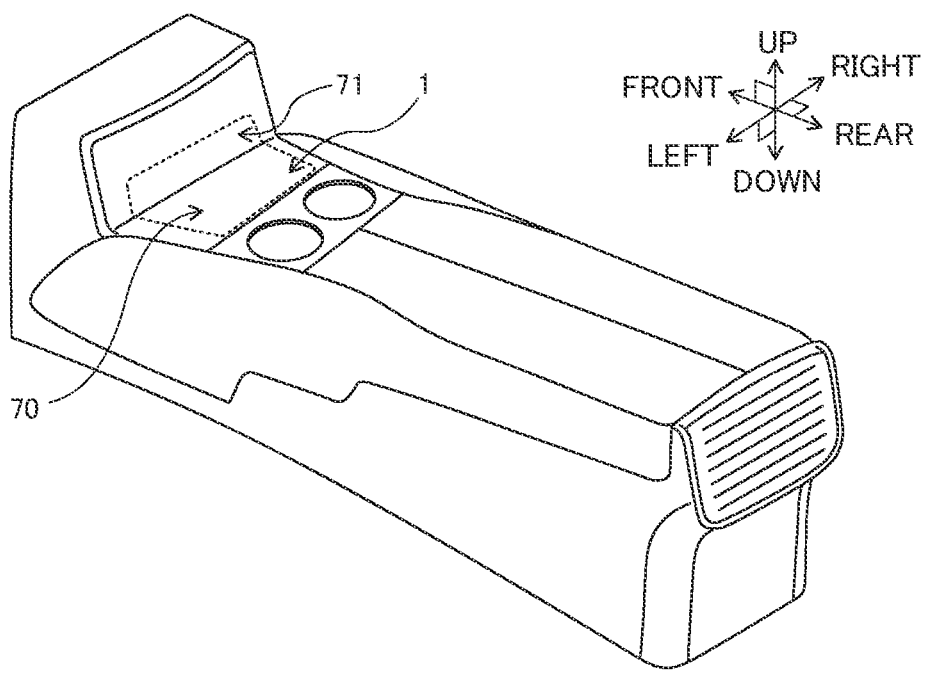
FIG. 6 schematically illustrates a center console box and an on-vehicle human sensing switch according to Embodiment 2.
Figure 7:
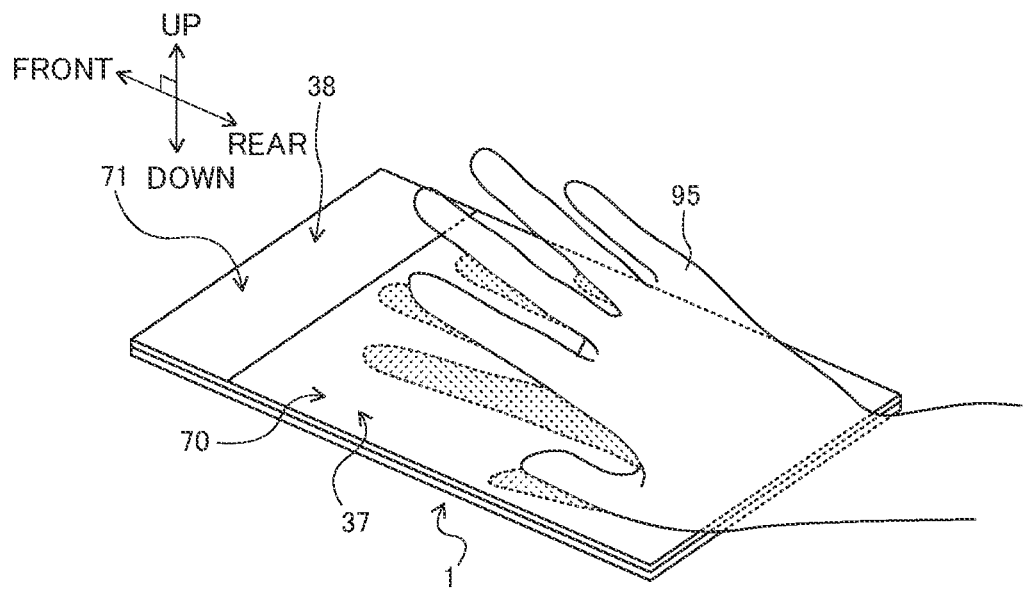
FIG. 7 schematically illustrates a positional relationship between a touch panel substrate body in an on-vehicle human sensing switch as a reference example, and a hand of a user.
Figure 8:
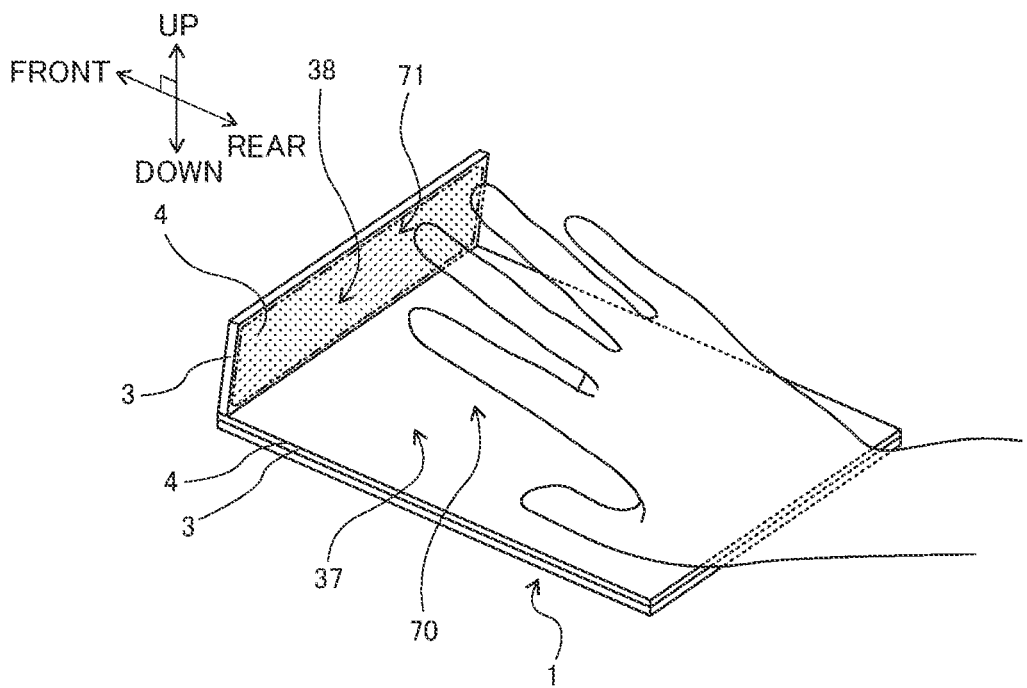
FIG. 8 schematically illustrates a positional relationship between a touch panel substrate body in the on-vehicle human sensing switch according to Embodiment 2, and the hand of the user.

An on-vehicle human sensing switch according to Embodiment 2 is substantially identical to the on-vehicle human sensing switch according to Embodiment 1 except for a touch panel substrate body. FIG. 6 schematically illustrates a center console box and an on-vehicle human sensing switch 1 according to Embodiment 2. FIG. 7 schematically illustrates a positional relationship between a touch panel substrate body in an on-vehicle human sensing switch as a reference example, and a hand of the user. FIG. 8 schematically illustrates a positional relationship between the touch panel substrate body in the on-vehicle human sensing switch according to Embodiment 2, and a hand of the user.

Hereinafter, the on-vehicle human sensing switch according to Embodiment 2 is described focusing on differences from the on-vehicle human sensing switch according to Embodiment 1.

As shown in FIG. 6, the appearance of the on-vehicle human sensing switch 1 according to Embodiment 2 has a substantially L shape in which a front part is bent and raised with respect to a rear part.

As shown in FIG. 8, in the on-vehicle human sensing switch 1 according to Embodiment 2, the touch panel substrate body 3 has a substantially L shape, and the decorative body 4 also has a substantially L shape following the shape of the touch panel substrate body 3. The switch electrode 70 is disposed in the rear part of the touch panel substrate body 3. The sensor electrode 71 is disposed in the front part of the touch panel substrate body 3.

Specifically, the touch panel substrate body 3 includes: a main area 37 which corresponds to the rear part and includes the switch electrode 70; and a sub-area 38 which corresponds to the front part and includes the sensor electrode 71.

As shown in FIG. 7, when it is difficult for fingers 95 of the user to reach the sub-area 38 and the distance between the sensor electrode 71 disposed in the sub-area 38 and the fingers 95 of the user is long, it is difficult to accurately detect approach of the fingers 95 of the user by the sensor electrode 71 disposed in the sub-area 38.

Meanwhile, in the on-vehicle human sensing switch 1 according to Embodiment 2 shown in FIG. 8, the sub-area 38 and the main area 37 are arranged such that the upper surface of the sub-area 38 extends in a direction intersecting the upper surface of the main area 37. Therefore, the sensor electrode 71 disposed in the sub-area 38 is brought close to the fingers 95 of the user, whereby approach of the fingers 95 of the user is more accurately detected by the sensor electrode 71 disposed in the sub-area 38.

The sensor electrode 71 may be disposed in both the sub-area 38 and the main area 37. In this case, probability of detecting approach of the fingers 95 of the user by the sensor electrodes 71 is further increased, whereby the detection accuracy of the sensor electrodes 71 is further enhanced.

The present invention is not limited to the embodiments described above and shown in the drawings, but may be modified as appropriate without deviating from the gist of the present invention. Furthermore, components described in the present specification including the embodiments may be optionally extracted and combined to be implemented.

DESCRIPTION OF THE REFERENCE CHARACTERS

1 on-vehicle human sensing switch
2 display 20 switch image
21 display area
3 touch panel substrate body
31 film substrate (substrate)
35 terminal portion
37 switch area
38 sensor area
4 decorative body
70 switch electrode
71 sensor electrode
72 switch lead part
73 sensor lead part
91 vehicle-mounted electronic device
95 fingers of user (detection target)

The invention claimed is:

1. An on-vehicle human sensing switch, comprising:
a display having a display area for luminously displaying a switch image of a vehicle-mounted electronic device;
a light transmission type touch panel substrate body disposed on the display; and
a light transmission type decorative body disposed on the touch panel substrate body, wherein
the touch panel substrate body includes, on a substrate, an electrostatic capacitance type sensor electrode configured to detect approach of a detection target, and an electrostatic capacitance type switch electrode which is disposed at a position opposing the display area and is configured to detect an action of the detection target,
when approach of the detection target is detected by the sensor electrode, the switch image is displayed on the display,
the touch panel substrate body includes a main area and a sub-area,
an upper surface of the main area and an upper surface of the sub-area extend in directions intersecting with each other,
the switch electrode is disposed in the main area, and the sensor electrode is disposed in the sub-area,
the sub-area is disposed in a front side of a vehicle with respect to the main area, and
the sub-area is bent and raised with respect to the main area.

2. The on-vehicle human sensing switch according to claim 1, wherein the touch panel substrate body includes, on a side opposite to the sensor electrode across the switch electrode, a terminal portion in which a switch lead part extending from the switch electrode and a sensor lead part extending from the sensor electrode are formed.

3. The on-vehicle human sensing switch according to claim 1, wherein the sensor electrode continuously surrounds the switch electrode.

4. The on-vehicle human sensing switch according to claim 1, wherein
the main area is disposed on an upper surface of the console box, and
the sub-area is disposed on a surface of the console box which is in the front side of the vehicle with respect to the upper surface of the console box and which is bent and raised with respect to the upper surface of the console box.

5. The on-vehicle human sensing switch according to claim 1, wherein
an intersection angle between the main area and the sub-area is between 20° and 175°.

6. A light transmission type touch panel substrate body comprising:
a substrate;
an electrostatic capacitance type sensor electrode configured to detect approach of a detection target, and an electrostatic capacitance type switch electrode configured to detect an action of the detection target, the sensor electrode and the switch electrode being formed on the substrate;
a main area; and
a sub-area, wherein
an upper surface of the main area and an upper surface of the sub-area extend in directions intersecting with each other,
the switch electrode is disposed in the main area, and the sensor electrode is disposed in the sub-area,
the sub-area is disposed in a front side of a vehicle with respect to the main area, and
the sub-area is bent and raised with respect to the main area.

7. The light transmission type touch panel substrate body of claim 6, wherein
an intersection angle between the main area and the sub-area is between 20° and 175°.

* * * * *